(12) United States Patent
Leussler et al.

(10) Patent No.: US 11,428,766 B2
(45) Date of Patent: Aug. 30, 2022

(54) METHOD FOR CONFIGURING A RF TRANSMIT ASSEMBLY

(71) Applicant: KONINKLIJKE PHILIPS N.V., Eindhoven (NL)

(72) Inventors: Christoph Leussler, Hamburg (NL); Peter Vernickel, Hamburg (DE)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 16/973,796

(22) PCT Filed: Jun. 6, 2019

(86) PCT No.: PCT/EP2019/064742
§ 371 (c)(1),
(2) Date: Dec. 10, 2020

(87) PCT Pub. No.: WO2019/238514
PCT Pub. Date: Dec. 19, 2019

(65) Prior Publication Data
US 2021/0373103 A1    Dec. 2, 2021

(30) Foreign Application Priority Data
Jun. 11, 2018    (EP) ..................................... 18176930

(51) Int. Cl.
*G01R 33/54*    (2006.01)
*G06N 20/00*    (2019.01)
*G01R 33/36*    (2006.01)

(52) U.S. Cl.
CPC ....... *G01R 33/543* (2013.01); *G01R 33/3614* (2013.01); *G06N 20/00* (2019.01)

(58) Field of Classification Search
CPC .. G01R 33/543; G01R 33/3614; G01R 33/36; G06N 20/00
See application file for complete search history.

(56) References Cited

U.S. PATENT DOCUMENTS

2002/0087056 A1    7/2002    Aceti et al.
2002/0087066 A1    7/2002    Hellinger
(Continued)

FOREIGN PATENT DOCUMENTS

JP    11244255 B2    9/1999
WO    2017009315 A1    1/2017

OTHER PUBLICATIONS

International Search Report and Written Opinion From PCT/EP2019/064742 dated Aug. 5, 2019.
(Continued)

*Primary Examiner* — Susan S Lee

(57) ABSTRACT

The present disclosure relates to a method for configuring a radio frequency, RF, transmit assembly (200) for a magnetic resonance imaging system (300) for acquiring magnetic resonance imaging data from a subject within an imaging zone using an RF pulse sequence, the RF transmit assembly (200) comprising an RF amplifier (215) and a transmit coil (213), wherein the RF transmit assembly (200) is configurable with a set of configuration parameters. The method comprises: providing (3001) operating conditions of the RF transmit assembly, the operating conditions being indicative of at least: a property of the RF pulse sequence and a measurable parameter that influences the RF pulse sequence property when operating the RF transmit assembly using the RF pulse sequence; using (3003) a predefined machine learning model for determining, for the operating conditions, at least part of the set of configuration parameters and associated values; configuring (3005) the RF transmit assembly (200) in accordance with the determined configuration parameters and associated values.

14 Claims, 4 Drawing Sheets

(56) References Cited

U.S. PATENT DOCUMENTS

| | | |
|---|---|---|
| 2002/0156595 A1 | 10/2002 | Hedlund et al. |
| 2003/0076896 A1 | 4/2003 | Ball |
| 2007/0075770 A1 | 4/2007 | Long |
| 2008/0090539 A1 | 4/2008 | Thompson |
| 2011/0167924 A1 | 7/2011 | Kimmlingen |
| 2013/0343483 A1 | 12/2013 | Bai |
| 2015/0302297 A1 | 10/2015 | Griswold et al. |
| 2019/0079151 A1 | 3/2019 | Leussler et al. |
| 2020/0077900 A1* | 3/2020 | Vaughan .............. A61B 5/0022 |

OTHER PUBLICATIONS

Julianna D. Ianni et al: "Machine learning RF shimming: Prediction by iteratively projected ridge regression", Magnetic Resonance in Medicine.,vol. 80, No. 5, Mar. 23, 2018 (Mar. 23, 2018), pp. 1871-1881, XP055529012,US.

Gezelter J D et al: "Use of neural networks to design shaped radiofrequency pulses", Journal of Magnetic Resonance, Academic Press, London, GB,vol. 90, No. 2,Nov. 1, 1990 (Nov. 1, 1990), pp. 397-404, XP023961052,ISSN: 0022-2364, DOI:10.1016/0022-2364(90)90149-4[retrieved on Nov. 1, 1990] p. 397-p. 400.

Jueschke et al., "Machine Learning using Neural Networks in Digital Signal Processing for RF Transceivers" EEE Africon 2017 Proceedings.

Zhenyu Wang et al.,"Deep neural nets based power amplifier non-linear Predistortion" 2017 J. Phys.: Conf. Ser. 887012049.

Bo Liu et al., "An Efficient High-Frequency Linear RF Amplifier Synthesis Method Based on Evolutionary Computation and Machine Learning Techniques"I EEE Transactions on Computer-Aided Design of Integrated Circuits and Systems, vol. 31, No. 7, Jul. 2012.

Manasjyoti Bhuyan et al., "Learning Aided Behavioral Modeling and Adaptive Digital Predistortion Design for Nonlinear Power Amplifier" IEEE Sensors Journal, vol. 16, No. 16, Aug. 15, 2016.

Jianfeng Zhai et al., "Behavioral Modeling of Power Amplifiers With Dynamic Fuzzy Neural Networks" IEEE Microwave and Wireless Components Letters, vol. 20, No. 9, Sep. 2010.

Xiangjun Jin et al., "Modeling of nonlinear system based on deep learning framework" Nonlinear Dyn (2016) 84:1327-1340 DOI 10.1007/s11071-015-2571-6.

Erhan, D., Courville, A., Bengio, Y., Vincent, P.: "Why does unsupervised pre-training help deep learning"J.Mach. Learn. Res 11(3), 625-660 (2010).

www.butleranalytics.com/20-machine learning service platforms (downloaded Dec. 4, 2020).

R. N. Braithwaite, "A Self-Generating Coefficient List for Machine Learning in RF Power Amplifiers using Adaptive Predistortion," 2006 European Microwave Conference, Manchester, 2006, pp. 1229-1232, doi: 10.1109/EUMC.2006.281199.

Peng, jun & He, Songbai & Wang, Bingwen & Dai, Zhijiang & Pang, Jingzhou. (2016). Digital Predistortion for Power Amplifier Based on Sparse Bayesian Learning. IEEE Transactions on Circuits and Systems II: Express Briefs. 63. 1-1.10.1109/TCSII.2016.2534718.

* cited by examiner

METHOD FOR CONFIGURING A RF TRANSMIT ASSEMBLY

CROSS REFERENCE TO RELATED APPLICATIONS

This application is a U.S. national phase application of International Application No. PCT/EP2019/064742 filed on Jun. 6, 2019, which claims the benefit of EP Application Serial No. 18176930.8 filed Jun. 11, 2018 and is incorporated herein by reference.

FIELD OF THE INVENTION

The invention relates to scanning imaging systems, in particular to a method for configuring a radio frequency (RF) transmit assembly.

BACKGROUND OF THE INVENTION

Transmit RF chains are configured to generate a desired spin excitation in a minimum period of time, while complying with technological and biological limits. The transmit RF chain of a magnetic resonance imaging (MRI) system contains one or more RF amplifiers which drive a MRI coil. The RF chain may consist of a digital RF pulse generator, a RF amplifier, analogue T/R switches and the MRI antenna. However, there is a continuous need to improve the control of the operation of the RF chains.

SUMMARY OF THE INVENTION

Various embodiments provide for a method for configuring a RF transmit assembly, medical analysis system, and computer program product, as described by the subject matter of the independent claims. Advantageous embodiments are described in the dependent claims.

The present disclosure relates to a hardware and software required to realize a MRI system with optimized RF transmit chain or assembly. A MRI RF transmit assembly is provided with a machine learning module that features machine learning. The module may use different machine learning algorithms for different RF assembly optimization such as pulse generation, digital pre-distortion, parameter setting of RF amplifier, impedance matching option and RF switch toggle and selection of the shim set in multi-channel TX systems. The different machine learning algorithms may have as input the current operating conditions of the RF transmit assembly. For the complete RF assembly, a set of learning algorithms for machine learning may be applied. Learning methods and strategies may be based on a cloud based implementation or local implementation. The machine-learning module is suited for different scenarios depending on the available data and amount of training time.

In one aspect, the invention relates to a method for configuring a radio frequency, RF, transmit assembly for a magnetic resonance imaging system for acquiring magnetic resonance imaging data from a subject within an imaging zone using a RF pulse sequence. The RF transmit assembly comprises a RF amplifier and a transmit coil, wherein the RF transmit assembly is configurable with a set of configuration parameters. The method comprises: providing operating conditions of the RF transmit assembly. The operating conditions are indicative of at least: a property of the RF pulse sequence and a measurable parameter that influences the RF pulse sequence property when operating the RF transmit assembly using the RF pulse sequence. A pre-defined machine learning model may be used for determining at least part of the set of configuration parameters and associated values for the operating conditions. The RF transmit assembly may be configured in accordance with the determined configuration parameters.

The provided operating conditions may be currently measured operating conditions while the RF transmit assembly is operating using the RF pulse sequence. In another example, the provided operating conditions may be desired operating conditions for which the RF transmit assembly is to be configured in order to function accordingly.

The term "machine learning" refers to a computer algorithm used to extract useful information from training data by building probabilistic models (referred to as machine learning (or learned) models) in an automated way. The machine learning may be performed using one or more learning algorithms such as linear regression, K-means, classification algorithm, reinforcement algorithm etc. A "model" may for example be an equation or set of rules that makes it possible to predict an unmeasured value (e.g. which configuration corresponds to a given operating condition) from other, known values and/or to predict or select an action to maximize a future reward or minimize a future penalty. According to one embodiment, the machine learning model is a deep learning model.

An ad-hoc analytic optimization, e.g. by a user, of dozens of input and output parameters within a given timeframe is impossible considering the amount of parameters and their non-linear (e.g. amplifier gain, fix parameter limits) interdependencies. The present method may enable to find the optimal configuration set for the RF transmit assembly based on a multi-dimensional approach involving multiple input parameters, wherein said parameters may be interdependent.

The present disclosure may enable to automate the operation of the RF transmit assembly. This may reduce the need for operator intervention for the configuration of the RF transmit assembly.

The present disclosure may further have the advantage to use the suitable configuration that is accurately defined in advance and may thus provide a cleaner RF transmit signal with less distortion and a more stable transmit signal in respect of phase and amplitude, relieve the RF-amplifier from internal stabilization circuitry, and reduce costs. According to one embodiment, the property of the pulse sequence comprises at least one of a: peak power, average power, pulse shape, total duration and frequency distribution, linearity. The property of the pulse sequence may enable to control the RF pulse sequence for the acquisition of the MR data. Such a control based on many properties may be virtually impossible to optimize manually.

According to one embodiment, the measurable parameter comprises at least one of ambient temperature, temperature of a cooling water of the RF transmit assembly, junction temperatures of components of the RF amplifier (e.g. temperature of RF LDMOS or temperature of heatsink), coil load of the transmit coil, power supply voltage, a power supply of the RF transmit assembly. The operating conditions may further be indicative of a subject (e.g. patient) weight, a subject height, imaging position, an anatomy to be scanned. The measurable parameter may further indicate B1 maps, B1 demands, status of capacitor banks or pick up loop signals. The transmit coil of the RF transmit assembly may be configured to transmit electromagnetic waves into a sample, thereby creating oscillating B1 magnetic field needed to excite nuclear spins. The B1 maps and B1 demands may be quantified be measurable parameter. A measurable parameter may for example be derived or determined from other one or more measurable parameters.

The more properties and measurable parameters used in the determination of the operating conditions the more accurate the set of selected of determined configuration parameters. Due to number and combinations of the properties and the measurable parameters and by contrast to the present method an ad-hoc configuration of the system may be not possible or at least may be a source of inaccuracy.

According to one embodiment, the set of configuration parameters comprises: an indication of a predistortion of the RF pulse sequence, a bias voltage at a predefined point of the RF transmit assembly, a drain voltage, a matching parameter for tuning a matching network of the RF transmit assembly, a switch threshold for a toggle switch of the RF amplifier, a temperature of cooling water e.g. used to cool components of the RF assembly. The set of configuration parameters may for example further indicate a selection of a shim set in a multi-channel TX system comprising the RF transmit assembly as one channel of the multiple channels. For example, the operating condition of the RF transmit assembly may indicate that there is a need of another RF assembly of the multi-channel TX system to be used. In one example, the operating condition may indicate to add e.g. additional local coils to achieve a required homogeneity.

The matching network may for example be configured for matching a given system input impedance with impedances of RF transistors of the RF amplifier for enabling a maximum power transfer. Predistortion may be used to improve the linearity of the output signal. The predistorision may be a cost-saving and power efficiency technique. The predistorsion technique enables simpler power-electronics in the RF-amplifier and to get more usable power and signal linearity from the RF amplifier. This may enable to drive the RF amplifier also in the nonlinear regime. The toggle switch may be a RF T/R switch.

According to one embodiment, the method further comprises: receiving a training set indicative of sets of configuration parameters in association with respective operating conditions of the RF transmit assembly; training a predefined machine learning algorithm using the training set, thereby generating the machine learning model. The training or learning may be realized by using cloud based algorithms or using local processor close to or in the RF transmit assembly. For example, different machine learning algorithms may be applied based on the available amount of data of the training set and the available processing resources. The training set may for example be collected from multiple MRI systems, wherein each MRI system comprises and RF assembly as described herein. This may increase the accuracy of the generated model. The training may for example be performed on a periodic basis. This may enable up-to-date models for an accurate prediction of the settings of the RF transmit assembly.

According to one embodiment, the method further comprises generating the training set comprising collecting data from at least one data source, and processing the collected data for determining the sets of configuration parameters in association with respective operation conditions, wherein the data source comprises at least one of log files of MRI systems, user reports indicative of operation of the RF transmit assembly, amplifier load pull data from factories e.g. obtained individually or in series (load data may be updated using scan data). This embodiment may enable a rich training set that can be used to provide reliable and accurate prediction models.

According to one embodiment, the method further comprises repeating the determining step for other provided operating conditions, and updating the training set using determined configuration parameters and provided operating conditions and repeating the training of the machine learning algorithm using the updated training set, wherein the determined configuration parameters are used for operation of the RF transmit assembly. The present disclosure may extend the parameter control of an RF chain by adding a learning module that remembers and reuse successful coefficient and parameter settings. This may further increase the accuracy of the predictions performed by the generated models.

According to one embodiment, using the predefined machine learning model for determining at least part of the set of configuration parameters is performed in response to detecting a current operating condition that is different from the provided operating condition. The RF chain with machine learning module can respond to changes in the operating condition automatically and faster than conventional RF chain devices.

According to one embodiment, the measurable parameter is a physical property of a first component of the RF transmit assembly. The method further comprises: providing multiple machine learning models each associated with a component of the RF transmit assembly; selecting the predefined machine learning model from the multiple machine learning models that is associated with the first component.

The present method may use different machine learning algorithms for different RF assembly optimization such as pulse generation, digital pre-distortion, parameter setting of RF amplifier, impedance matching option and RF switch toggle and selection of the shim set in multi-channel TX systems. For the complete RF assembly, a set of learning algorithms for machine learning may be applied. For example, the deep learning algorithm may be used to generate a deep learning model for determining the values of the configuration parameters of the RF amplifier and a decision tree learning may be used to generate a decision tree model for determining the values of the configuration parameters of the transmit coil. For example, a component (e.g. for RF shimming or matching of individual channels) that requires more configuration parameters than a second component (e.g. bias of LDMOS or cooling water temperature) may be associated with a first learning method (deep learning model) while a second learning method (e.g. linear learning model) may be sufficient for the second component. Having different algorithms dependent on the component of the RF transmit assembly may further increase the accuracy of the determined settings or configuration parameters of the RF transmit assembly.

According to one embodiment, the operating conditions further comprise another measurable parameter of a second component of the RF transmit assembly. The determining step comprises using the predefined machine learning model and another machine learning model of the second component for determining the at least part of the set of configuration parameters and associated values for the operating conditions.

In another aspect, the invention relates to a computer program product comprising machine executable instructions for execution by a processor, wherein execution of the machine executable instructions causes the processor to the methods of any of the preceding embodiments.

In another aspect, the invention relates to a medical analysis system (or medical control system) for configuring a radio frequency, RF, transmit assembly. The medical analysis system comprises: a memory containing machine executable instructions; and a processor for controlling the medical analysis system, wherein execution of the machine executable instructions causes the medical analysis system to:

provide operating conditions of the RF transmit assembly, the operating conditions being indicative of at least: a property of the RF pulse sequence and a measurable parameter that influences the RF pulse sequence property when operating the RF transmit assembly using the RF pulse sequence; —use a predefined machine learning model for determining at least part of the set of configuration parameters and associated values for the operating conditions;

configure the RF transmit assembly in accordance with the determined configuration parameters.

It is understood that one or more of the aforementioned embodiments of the invention may be combined as long as the combined embodiments are not mutually exclusive.

BRIEF DESCRIPTION OF THE DRAWINGS

In the following preferred embodiments of the invention will be described, by way of example only, and with reference to the drawings in which.

DETAILED DESCRIPTION OF THE EMBODIMENTS

In the following, like numbered elements in the figures are either similar elements or perform an equivalent function. Elements which have been discussed previously will not necessarily be discussed in later figures if the function is equivalent.

Various structures, systems and devices are schematically depicted in the figures for purposes of explanation only and so as to not obscure the present invention with details that are well known to those skilled in the art. Nevertheless, the attached figures are included to describe and explain illustrative examples of the disclosed subject matter.

Figure 1:
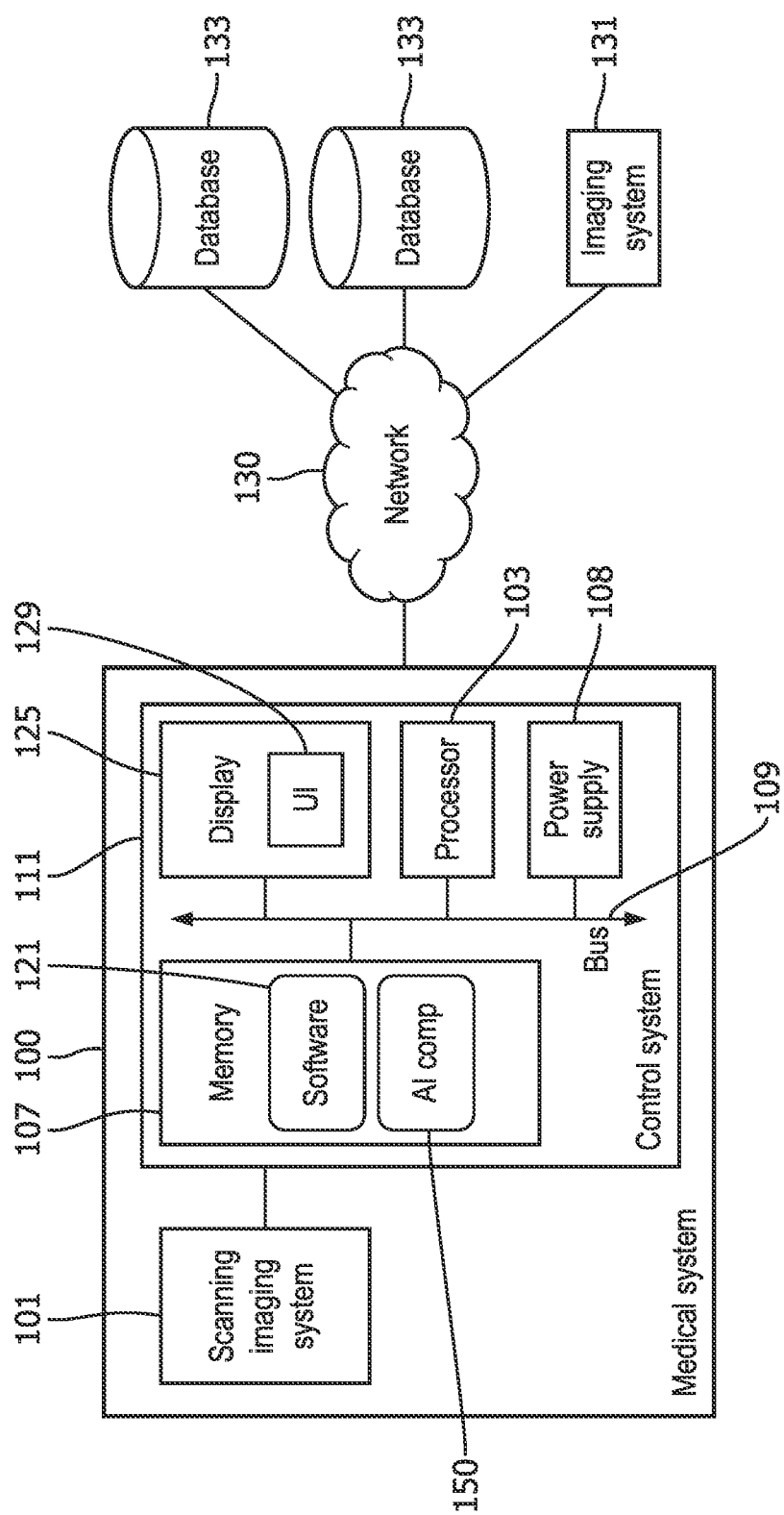
FIG. 1 is a schematic diagram of a medical analysis system.

FIG. 1 is a schematic diagram of a medical analysis system 100. The medical analysis system 100 comprises a control system 111 that is configured to connect to a scanning imaging system (or acquisition component) 101. The control system 111 comprises a processor 103, a memory 107 each capable of communicating with one or more components of the medical system 100. For example, components of the control system 111 are coupled to a bidirectional system bus 109.

It will be appreciated that the methods described herein are at least partly non-interactive, and automated by way of computerized systems. For example, these methods can further be implemented in software 121, (including firmware), hardware, or a combination thereof. In exemplary embodiments, the methods described herein are implemented in software, as an executable program, and is executed by a special or general-purpose digital computer, such as a personal computer, workstation, minicomputer, or mainframe computer.

The processor 103 is a hardware device for executing software, particularly that stored in memory 107. The processor 103 can be any custom made or commercially available processor, a central processing unit (CPU), an auxiliary processor among several processors associated with the control system 111, a semiconductor based microprocessor (in the form of a microchip or chip set), a macroprocessor, or generally any device for executing software instructions. The processor 103 may control the operation of the scanning imaging system 101.

The memory 107 can include any one or combination of volatile memory elements (e.g., random access memory (RAM, such as DRAM, SRAM, SDRAM, etc.)) and nonvolatile memory elements (e.g., ROM, erasable programmable read only memory (EPROM), electronically erasable programmable read only memory (EEPROM), programmable read only memory (PROM). Note that the memory 107 can have a distributed architecture, where various components are situated remote from one another, but can be accessed by the processor 103. Memory 107 may store an instruction or data related to at least one other constituent element of the medical system 100.

The control system 111 may further comprise a display device 125 which displays characters and images and the like e.g. on a user interface 129. The display device 125 may be a touch screen display device.

The medical analysis system 100 may further comprise one or more power supplies 108 for powering the medical analysis system 100. A power supply of the power supplies 108 may for example be a battery or an external source of power, such as electricity supplied by a standard AC outlet.

The scanning imaging system 101 may comprise at least one of MRI, CT and PET-CT imagers. The control system 111 and the scanning imaging system 101 may or may not be an integral part. In other terms, the control system 111 may or may not be external to the scanning imaging system 101.

Figure 3:
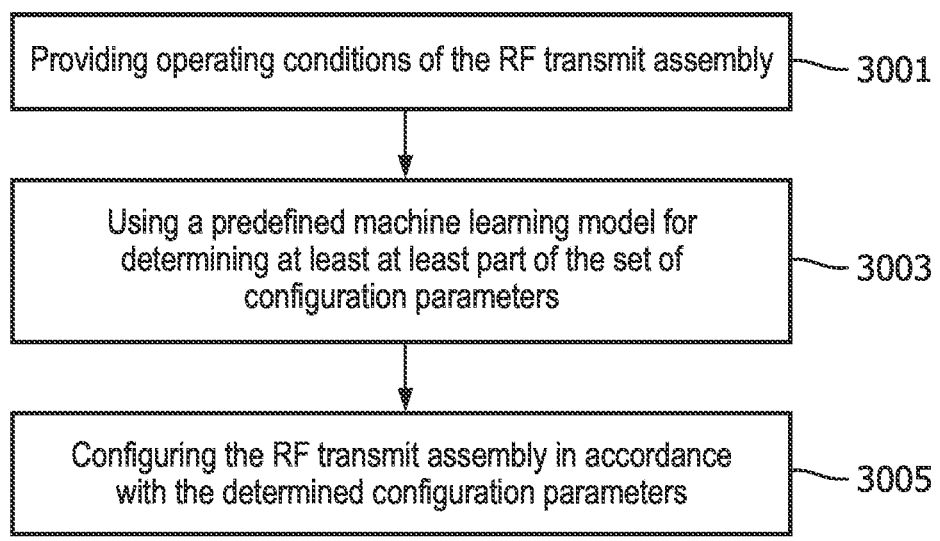
FIG. 3 is a flowchart of a method for configuring a radio frequency, RF, transmit assembly.

The scanning imaging system 101 comprises components that may be controlled by the processor 103 in order to configure the scanning imaging system 101 to provide image data to the control system 111. The configuration of the scanning imaging system 101 may enable the operation of the scanning imaging system 101. The operation of the scanning imaging system 101 may for example be automatic. FIG. 3 shows example of components of the scanning imaging system 101 being an MRI system.

The connection between the control system 111 and the scanning imaging system 101 may for example comprise a BUS Ethernet connection, WAN connection, Internet connection etc.

In one example, the scanning imaging system 101 may be configured to provide output data such as images in response to a specified measurement. The control system 111 may be configured to receive data such as survey image data from the MRI scanning imaging system 101. For example, the processor 103 may be adapted to receive information (automatically or upon request) from the scanning imaging system 101 in a compatible digital form so that such information may be displayed on the display device 125. Such information may include operating parameters, alarm notifications, and other information related to the use, operation and function of the scanning imaging system 101.

The medical analysis system 100 may be configured to communicate via a network 130 with other scanning imaging systems 131 and/or databases 133. The network 130 comprises for example a wireless local area network (WLAN) connection, WAN (Wide Area Network) connection LAN (Local Area Network) connection or a combination thereof. The databases 133 may comprise information relates to patients, scanning imaging systems, anatomies, scan geometries, scan parameters, scans etc. The databases 133 may for example comprise an EMR database comprising patients' EMR, Radiology Information System database, medical image database, PACS, Hospital Information System database and/or other databases comparing data that can be used for planning a scan geometry. The databases 133 may for example comprise training sets used for generating machine learning models. Additionally or alternatively the training sets may be stored in a local storage (e.g. disk storage or memory) of the control system 111.

The memory 107 may further comprise an artificial intelligence (AI) component 150 (also referred to as machine-learning module). The AI component 150 may or may not be part of software component 121. The AI component 150 may be configured for automatically determining settings or configuration parameters of a RF transmit assembly of the scanning imaging system 101 based on predefined operating conditions of the RF transmit assembly.

The AI component 150 may be configured to perform machine learning on training sets in order to generate one or more machine learning models for predicting the configuration parameters and their values for the RF transmit assembly. The AI component 150 may be configured to use different machine learning algorithms for different RF assembly optimization or configuration such as pulse generation, digital pre-distortion, parameter setting of RF amplifier, impedance matching option and RF switch toggle and selection of the shim set in multi-channel TX systems. The generated machine learning models may be stored in a storage are such as memory 107 of the control system 111.

The AI component 150 may for example be configured to generate control signals for configuring the RF transmit assembly in accordance with the determined or predicted configuration parameters by the machine learning models.

The AI component 150 may be configured to recognize when the controlling of the RF transmit assembly has converged, correlate the coefficient setting of the RF transmit assembly with the measured operating condition of the RF transmit assembly, and store both in memory. For example, the convergence may be determined by configuring the scanning imaging system 101 (e.g. a MRI system) to acquire image data on reproducible conditions e.g. using a test scan with an unloaded body coil which should provide similar outcome for the multiple acquisitions as an indication of the convergence. The convergence may for example be detected by observing local distributed RF sensors located in an antenna element or by directly monitoring the k space data or reconstructed MR image. The AI component 150 may further be configured to monitor the present operating condition and, in response to abrupt changes, restores past coefficients that were successful under similar conditions.

Figure 2:
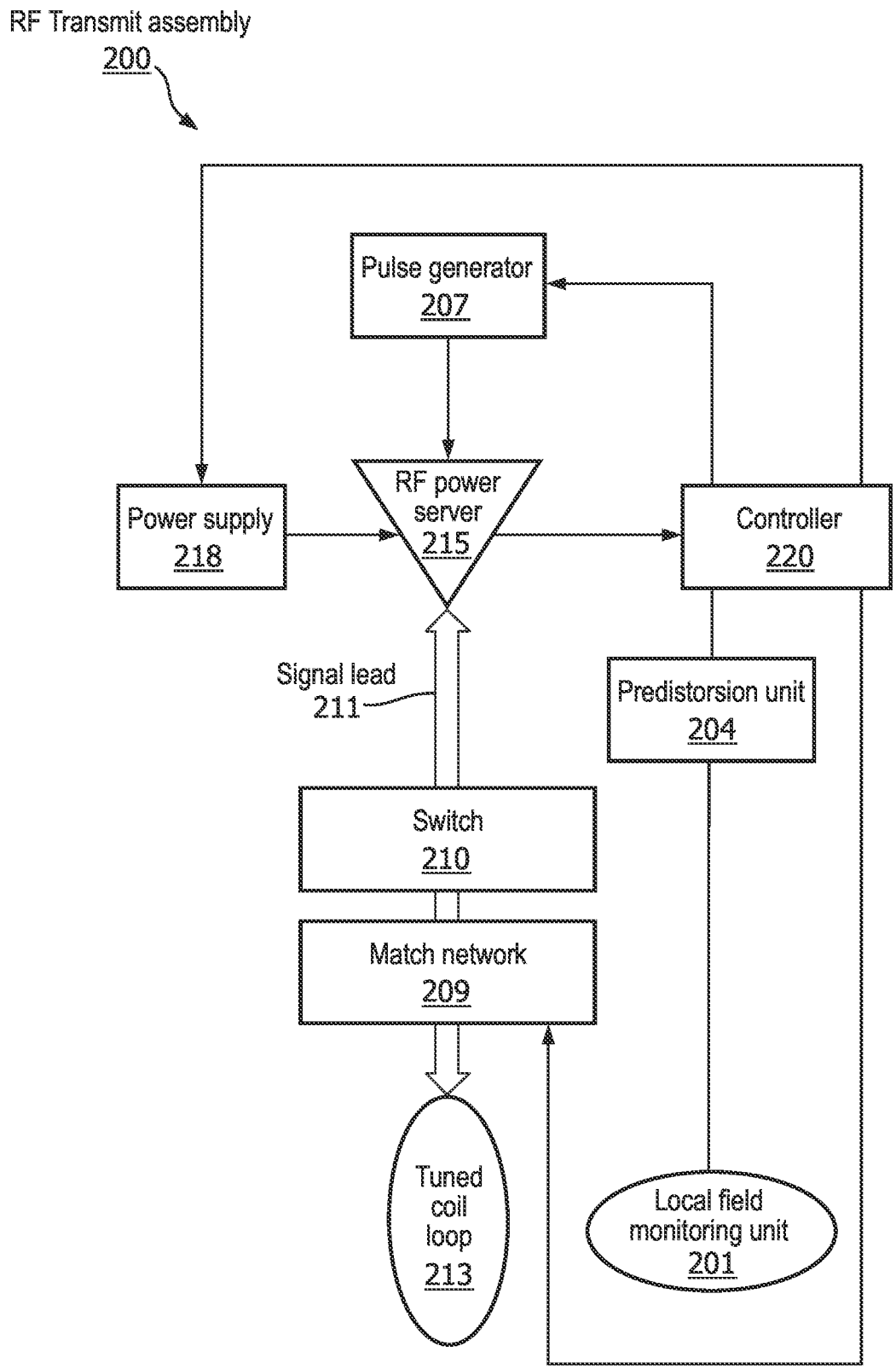
FIG. 2 is a schematic representation of an example RF transmit assembly for MRI systems.

FIG. 2 is a schematic representation of an example RF transmit assembly 200 for MRI systems e.g. the RF transmit assembly 200 may be part of the scanning imaging system 101. The RF assembly of FIG. 2 is shown for exemplification and clarification purpose; other RF assemblies may be configured in accordance with the present method. The signal lead 211, for example a coax cable couples the RF power source 215 to the RF transmission element 213. The RF power source 215 may be implemented as an adjustable RF amplifier. The RF transmission element 213 may be implemented as a tuned coil loop. The RF transmission element 213 may be a dipole coil element, as used for UHF applications. The loop may be located in the centre of the dipole as there the electrical current is maximal. In another example, the RF transmission element 213 may be a TEM coil element or a body coil. The RF amplifier 215 is connected via a signal lead 211 to a T/R switch 210 and a matching network 209. The matching network 209 is connected to the coil loop 213. A pulse generator 207, which may be a digitally controlled transmitter, is configured to supply pulsed alternating current signals with defined timing, phase and amplitude modulation to the RF amplifier 215. For example, the pulse generator 207 may generate excitation pulses and provides these pulses to the RF coil 213 through RF amplifier 215, switch 210 and matching network 209. The RF transmit assembly 200 further comprises a power supply 218. The power supply 218 may be a DC power supply that is configured to convert AC line voltages into DC voltages that are suitable to operate the RF amplifier 215.

The RF transmit assembly 200 is further provided with a local field monitoring unit 201. The local field monitoring unit 201 is configured to pick-up a small amount of energy of the transmitted RF (B1) field from the tuned coil loop 213. The local field monitoring unit 201 may be implemented as a small pick-up coil. A low puc-signal is generated by the pick-up coil which is a weak electric voltage or current signal. The low puc-signal is fed to a pre-distortion unit 204. The pre-distortion unit 204 is configured to generate using the received pick up coil or directional coupler signal coefficient setting for controlling the phase and magnitude for pulse generation. Signals are then provided to the pulse generator 207 e.g. via a controller 220. The controller 220 is configured to control the pulse generator 207 to generate a selected RF waveform that is used to control the RF amplifier 215 to produce the drive signal in accordance with the selected RF waveform so that the desired B1-field is transmitted by the tuned coil loop 213.

The controller 220 is further configured to monitor several operating parameters of the RF transmit assembly 200 such as DC voltages, currents, pulse width, duty factor, RF output power, temperature of the RF amplifier 215, peak power, average power, pulse shape (linearity demands), total duration, frequency spread (within the MR bandwidth) of RF pulses. The operating parameters may further comprise the ambient temperature or temperature of the cooling water, measured or predicted junction temperatures of the MOSFETS of the RF amplifier 215, coil load (patient weight and position), power supply voltage, bias voltage etc.

The RF transmit assembly 200 may be configured to connect to the control system 111. The controller 220 which may be an active digital controller is further configured to receive signals from the control system 111 e.g. from the AI component 150. In one example, the controller 220 and/or pulse generator 207 may be part of the control system 111.

The RF transmit assembly 200 may be configured through multiple configuration parameters. For example, each of the components 204, 207, 209, 215 and 218 may be associated with respective configuration parameters. For certain configuration parameters, there are fix absolute limits, such as maximum peak power of the RF amplifier 215 or maximum coil currents of the coil 213. Other configuration parameters may depend on the temporal evolution of the RF waveforms, such as the maximum available short term average RF power, which depends on the pulse shape and the RF power applied in the close past.

The RF transmit assembly 200 may be used for a multi-channel transmission system. For example, multiple transmit systems may be part of the multi-channel transmission system, wherein each transmit system comprises the components, other than the coil 213, of the RF transmit assembly 200. The multiple transmit systems are connected to the coil 213. In this case, the controller 220 of each of the transmit systems may receive input data from other transmit systems e.g. for linearization and control/sense of coupling between the individual transmit systems. Components of the RF assembly 200 e.g. the RF amplifier, may be cooled by water chillers.

FIG. 3 is a flowchart of a method for operating the RF transmit assembly 200 e.g. in a MRI system such as the one described with reference to FIG. 4.

In step 3001, operating conditions of the RF transmit assembly 200 may be provided or determined. The operating conditions are indicative of at least: a property of the RF pulse sequence and a measurable parameter that influences the RF pulse sequence property when operating the RF transmit assembly 200 using the RF pulse sequence. For example, the operating conditions may be desired operating conditions that are user pre-defined. The operating conditions may be the current measured operating conditions.

For example, the value of the peak power demand (requirement) from the RF amplifier 215 may be determined from patient data and/or RF pulses. In addition, the temperature of the cooling water may be measured. The two measured values may be provided as input to the AI component 150. The two measured values may indicate an example of the current operating conditions of the RF transmit assembly 200.

In step 3003, using the input operating conditions, a predefined machine learning model may be used e.g. by the AI component 150 for determining at least part of the set of configuration parameters and associated values. Following the above example, the demand values of the peak power and the cooling water temperature may be provided as input to a deep learning model that has been generated by the AI component 150. Using the input values, the deep learning model may identify a subset of the set of configuration parameters of the RF transmit assembly 200 that needs to be set or changed in order to match the current input operating conditions. For example, if the peak power is smaller than the peak power demand in a previous iteration or as initially set, the power supply of the RF amplifier may be configured so as to provide a convenient DC supply value for enabling the current level for the current value of the peak power. And if the cooling water temperature is higher than a maximum predefined temperature threshold, a source of power dissipation such as the DC supply may be decreased so as to keep the temperature to a predefined level. However, since the value of the selected configuration parameter, e.g. DC supply, may affect the two operating conditions (e.g. and affect other operating conditions such as scan time which may be due to a reduced allowed average power of the RF pulse because of a chosen DC supply), a value for the DC supply may be difficult to set by a user. The deep learning model may be able to determine the optimal value of the DC supply that can be used for meeting both current operating conditions.

The deep learning model may for example be generated using the AI component 150. The AI component 150 may for example receive a training set comprising sets of configuration parameters in association with respective operating conditions of the RF transmit assembly 200. For example, log files may be received from multiple MRI systems by the AI component 150, wherein the log files are indicative of the operating conditions and associated set of configuration parameters. For example, successful coefficient settings or sets of configuration parameters may be stored in a list that is indexed using a multi-dimensional attribute vector derived from the measured operating conditions. The size of the list is dynamic, growing, as more operating conditions are experienced and contracting as neighboring elements are recognized as redundant. The following table provides an example of sets of configuration parameters and associated operating conditions (configurations are referred to as set1 and set2 and respective operating conditions as OC1 and OC2). The operating conditions are determined in this example by the values of the Voltage Standing Wave Ratio (VSWR), coil load factor and the B1 peak value. The associated configuration parameters are the Vdd, bias current Ibias (e.g. at MOSFTS) and the number of MOSFETS to be used.

| set | Vdd In V | Ibias In mA | Number of MOSFETS | OC | VSWR | Coil load factor | B1 peak uT |
| --- | --- | --- | --- | --- | --- | --- | --- |
| Set1 | 50 | 300 | 6 | OC1 | 1.25 | 1.1 | 10 |
| Set2 | 55 | 500 | 8 | OC2 | 2 | 1.5 | 13.5 |

The AI component 150 may run a predefined machine learning algorithm such as a deep learning algorithm, using the training set in order to generate the machine learning model. The training may for example be executed on a cloud platform e.g. Algorithms.io. This may particularly be advantageous for machine learning algorithms to classify streaming data from connected systems e.g. multiple MRI systems providing data of the training set to the AI component 150.

In step 3005, the RF transmit assembly 200 may be configured in accordance with the determined configuration parameters. Following the above example, the DC supply may be configured using the values determined by the deep learning model. The configured RF transmit assembly may be used in a MRI system for acquiring image data from a subject in an imaging zone of the MRI system.

Steps 3001-3005 may for example be repeated on a periodic basis e.g. every day or in response to a change in the operating conditions. For example, if the current operating conditions are different from the operating conditions of the last iteration, steps 3001-3005 may be repeated. For example, the controller 220 may be configured to modify predistortion coefficient setting continually and other parameters such as bias, V drain, matching, switch toggling as the operating condition changes.

Figure 4:
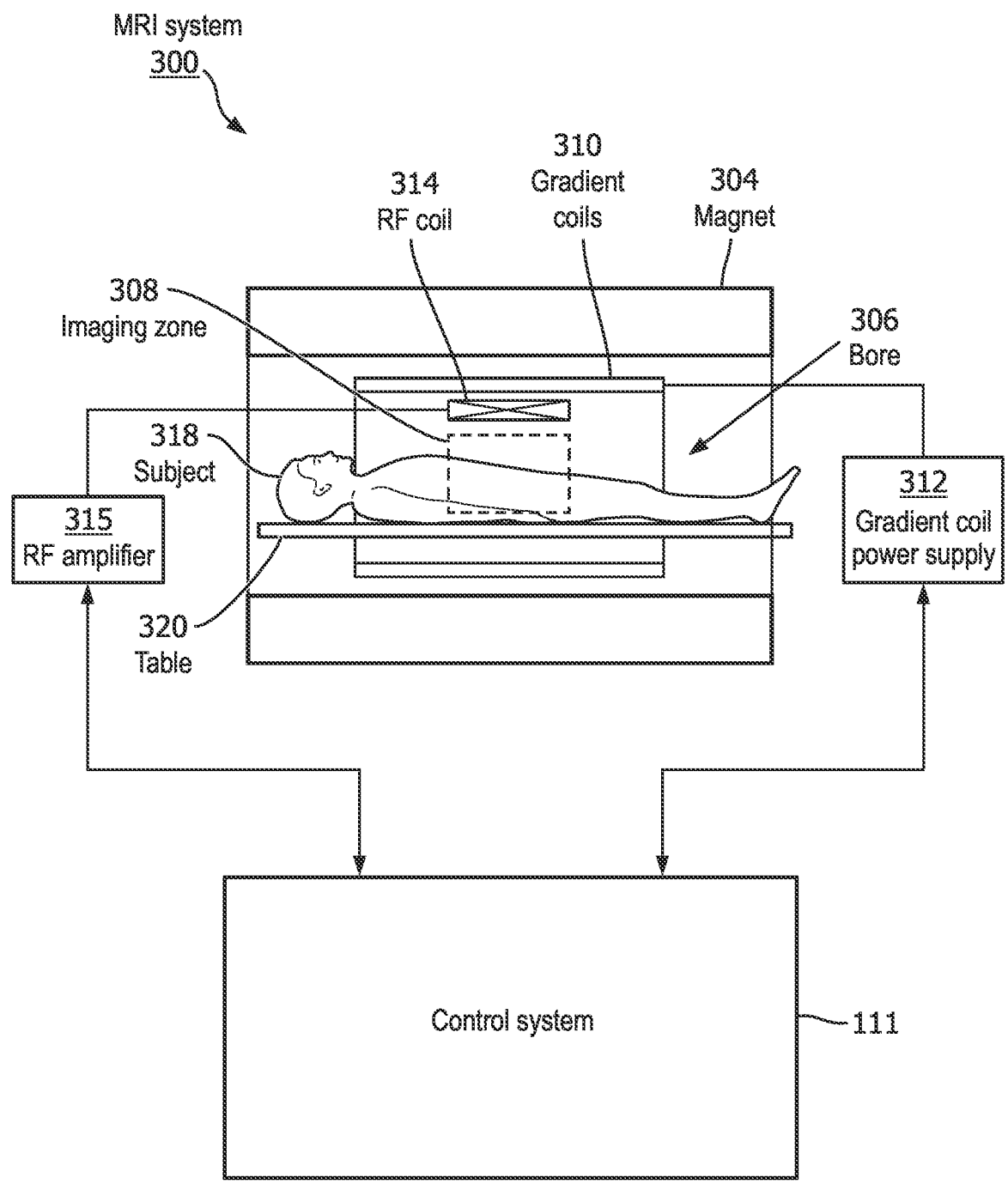
FIG. 4 shows a cross-sectional and functional view of an MRI system.

FIG. 4 illustrates a magnetic resonance imaging system 300 as an example of the medical system 100. The magnetic resonance imaging system 300 comprises a magnet 304. The magnet 304 is a superconducting cylindrical type magnet with a bore 306 in it. The use of different types of magnets is also possible; for instance, it is also possible to use both a split cylindrical magnet and a so called open magnet. A split cylindrical magnet is similar to a standard cylindrical magnet, except that the cryostat has been split into two sections to allow access to the iso-plane of the magnet. Such magnets may for instance be used in conjunction with charged particle beam therapy. An open magnet has two magnet sections, one above the other with a space in-between that is large enough to receive a subject 318 to be imaged, the arrangement of the two sections area similar to that of a Helmholtz coil. Inside the cryostat of the cylindrical magnet there is a collection of superconducting coils. Within the bore 306 of the cylindrical magnet 304 there is an imaging zone or volume or anatomy 308 where the magnetic field is strong and uniform enough to perform magnetic resonance imaging.

Within the bore 306 of the magnet there is also a set of magnetic field gradient coils 310 which is used during acquisition of magnetic resonance data to spatially encode magnetic spins of a target volume within the imaging volume or examination volume 308 of the magnet 304. The magnetic field gradient coils 310 are connected to a magnetic field gradient coil power supply 312. The magnetic field gradient coils 310 are intended to be representative. Typically, magnetic field gradient coils 310 contain three separate sets of coils for the encoding in three orthogonal spatial directions. A magnetic field gradient power supply supplies current to the magnetic field gradient coils. The current supplied to the magnetic field gradient coils 310 is controlled as a function of time and may be ramped or pulsed.

MRI system 300 further comprises an RF coil 314 at the subject 318 and adjacent to the examination volume 308 for generating RF excitation pulses. The RF coil 314 may include for example a set of surface coils or other specialized RF coils. The RF coil 314 may be used alternately for transmission of RF pulses as well as for reception of magnetic resonance signals e.g., the RF coil 314 may be implemented as a transmit array coil comprising a plurality of RF transmit coils. The RF coil 314 is connected to one or more RF amplifiers 315. Elements 314-315 may form an example RF transmit assembly of the MRI system 300.

The magnetic field gradient coil power supply 312 and the RF amplifier 315 are connected to a hardware interface of control system 111. The memory 107 of control system 111 may for example comprise a control module. The control module contains computer-executable code which enables the processor 103 to control the operation and function of the magnetic resonance imaging system 300. It also enables the basic operations of the magnetic resonance imaging system 300 such as the acquisition of magnetic resonance data.

As will be appreciated by one skilled in the art, aspects of the present invention may be embodied as an apparatus, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a 'circuit', 'module' or 'system'. Furthermore, aspects of the present invention may take the form of a computer program product embodied in one or more computer readable medium(s) having computer executable code embodied thereon.

Any combination of one or more computer readable medium(s) may be utilized. The computer readable medium may be a computer readable signal medium or a computer readable storage medium. A 'computer-readable storage medium' as used herein encompasses any tangible storage medium which may store instructions which are executable by a processor of a computing device. The computer-readable storage medium may be referred to as a computer-readable non-transitory storage medium. The computer-readable storage medium may also be referred to as a tangible computer readable medium. In some embodiments, a computer-readable storage medium may also be able to store data which is able to be accessed by the processor of the computing device. Examples of computer-readable storage media include, but are not limited to: a floppy disk, a magnetic hard disk drive, a solid state hard disk, flash memory, a USB thumb drive, Random Access Memory (RAM), Read Only Memory (ROM), an optical disk, a magneto-optical disk, and the register file of the processor. Examples of optical disks include Compact Disks (CD) and Digital Versatile Disks (DVD), for example CD-ROM, CD-RW, CD-R, DVD-ROM, DVD-RW, or DVD-R disks. The term computer readable-storage medium also refers to various types of recording media capable of being accessed by the computer device via a network or communication link. For example, a data may be retrieved over a modem, over the internet, or over a local area network. Computer executable code embodied on a computer readable medium may be transmitted using any appropriate medium, including but not limited to wireless, wireline, optical fiber cable, RF, etc., or any suitable combination of the foregoing.

A computer readable signal medium may include a propagated data signal with computer executable code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

A 'computer memory' or 'memory' is an example of a computer-readable storage medium. A computer memory is any memory which is directly accessible to a processor. A 'computer storage' or 'storage' is a further example of a computer-readable storage medium. A computer storage is any non-volatile computer-readable storage medium. In some embodiments computer storage may also be computer memory or vice versa.

A 'processor' as used herein encompasses an electronic component which is able to execute a program or machine executable instruction or computer executable code. References to the computing device comprising 'a processor' should be interpreted as possibly containing more than one processor or processing core. The processor may for instance be a multi-core processor. A processor may also refer to a collection of processors within a single computer system or distributed amongst multiple computer systems. The term computing device should also be interpreted to possibly refer to a collection or network of computing devices each comprising a processor or processors. The computer executable code may be executed by multiple processors that may be within the same computing device or which may even be distributed across multiple computing devices.

Computer executable code may comprise machine executable instructions or a program which causes a processor to perform an aspect of the present invention. Computer executable code for carrying out operations for aspects of the present invention may be written in any combination of one or more programming languages, including an object-oriented programming language such as Java, Smalltalk, C++ or the like and conventional procedural programming languages, such as the 'C' programming language or similar programming languages and compiled into machine executable instructions. In some instances, the computer executable code may be in the form of a high-level language or in a pre-compiled form and be used in conjunction with an interpreter which generates the machine executable instructions on the fly.

The computer executable code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described with reference to flowchart illustrations and/or block diagrams of methods, apparatus (systems) and computer program products according to embodiments of the invention. It will be understood that each block or a portion of the blocks of the flowchart, illustrations, and/or block diagrams, can be implemented by computer program instructions in form of computer executable code when applicable. It is further understood that, when not mutually exclusive, combinations of blocks in different flowcharts, illustrations, and/or block diagrams may be combined. These computer program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

A 'user interface' as used herein is an interface which allows a user or operator to interact with a computer or computer system. A 'user interface' may also be referred to as a 'human interface device'. A user interface may provide information or data to the operator and/or receive information or data from the operator. A user interface may enable input from an operator to be received by the computer and may provide output to the user from the computer. In other words, the user interface may allow an operator to control or manipulate a computer and the interface may allow the computer indicate the effects of the operator's control or manipulation. The display of data or information on a display or a graphical user interface is an example of providing information to an operator. The receiving of data through a keyboard, mouse, trackball, touchpad, pointing stick, graphics tablet, joystick, gamepad, webcam, headset, gear sticks, steering wheel, pedals, wired glove, dance pad, remote control, and accelerometer are all examples of user interface components which enable the receiving of information or data from an operator.

A 'hardware interface' as used herein encompasses an interface which enables the processor of a computer system to interact with and/or control an external computing device and/or apparatus. A hardware interface may allow a processor to send control signals or instructions to an external computing device and/or apparatus. A hardware interface may also enable a processor to exchange data with an external computing device and/or apparatus. Examples of a hardware interface include, but are not limited to: a universal serial bus, IEEE 1394 port, parallel port, IEEE 1284 port, serial port, RS-232 port, IEEE-488 port, Bluetooth connection, Wireless local area network connection, TCP/IP connection, Ethernet connection, control voltage interface, MIDI interface, analog input interface, and digital input interface.

A 'display' or 'display device' as used herein encompasses an output device or a user interface adapted for displaying images or data. A display may output visual, audio, and or tactile data. Examples of a display include, but are not limited to: a computer monitor, a television screen, a touch screen, tactile electronic display, Braille screen, Cathode ray tube (CRT), Storage tube, Bistable display, Electronic paper, Vector display, Flat panel display, Vacuum fluorescent display (VF), Light-emitting diode (LED) displays, Electroluminescent display (ELD), Plasma display panels (PDP), Liquid crystal display (LCD), Organic light-emitting diode displays (OLED), a projector, and Head-mounted display.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims. In the claims, the word 'comprising' does not exclude other elements or steps, and the indefinite article 'a' or 'an' does not exclude a plurality. A single processor or other unit may fulfill the functions of several items recited in the claims. The mere fact that certain measures are recited in mutually different dependent claims does not indicate that a combination of these measured cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

LIST OF REFERENCE NUMERALS 100 medical system
101 scanning imaging system
103 processor
107 memory
108 power supply of a medical analysis system
109 bus
111 control system
121 software
125 display
129 user interface
150 AI component
200 RF assembly
201 pick up coil
204 predistorsion system
207 pulse generator
209 matching network
210 switch
211 signal lead
213 coil
215 RF amplifier 218 power supply of a RF transmit assembly
220 controller
3001-3005 method steps
300 magnetic resonance imaging system
304 magnet
306 bore of magnet
308 imaging zone
310 magnetic field gradient coils
312 magnetic field gradient coil power supply
314 radio-frequency coil
315 RF amplifier
318 subject.

The invention claimed is:

1. A method for configuring a radio frequency (RF) transmit assembly for a magnetic resonance imaging system for acquiring magnetic resonance imaging data from a subject within an imaging zone using an RF pulse sequence, the RF transmit assembly comprising an RF amplifier and a transmit coil, wherein the RF transmit assembly is configurable with a set of configuration parameters, the method comprising:
providing operating conditions of the RF transmit assembly, the operating conditions being indicative of at least: a property of the RF pulse sequence and a measurable parameter that influences the RF pulse sequence property when operating the RF transmit assembly using the RF pulse sequence, wherein the measurable parameter comprises at least one of ambient temperature, temperature of a cooling water of the RF transmit assembly, junction temperatures of components of the RF amplifier, coil load of the transmit coil, power supply voltage of a power supply of a medical analysis system, power supply voltage of a power supply of the RF transmit assembly, the operating conditions being further indicative of a subject weight, subject height, imaging position, anatomy to be scanned;
using a predefined machine learning model for determining, for the operating conditions, at least part of the set of configuration parameters and associated values;
configuring the RF transmit assembly in accordance with the determined configuration parameters and associated values.

2. The method of claim 1, the property of the pulse sequence comprising at least one of a: peak power, average power, pulse shape, total duration and frequency distribution of the pulse.

3. The method of claim 1, wherein the set of configuration parameters comprises at least one of an indication of a predistortion of the RF pulse sequence, a bias voltage at a predefined point of the RF transmit assembly, a drain voltage, a matching parameter for tuning a matching network of the RF transmit assembly, a switch threshold for a toggle switch of the RF amplifier.

4. The method of claim 1, further comprising:
receiving a training set indicative of sets of configuration parameters in association with respective operating conditions of the RF transmit assembly;
training a predefined machine learning algorithm using the training set, thereby generating the machine learning model.

5. The method of claim 4, further comprising generating the training set comprising collecting data from at least one data source, and processing the collected data for determining the sets of configuration parameters in association with respective operation conditions, wherein the data source comprises at least one of log files of MRI systems, user reports indicative of operation of the RF transmit assembly.

6. The method of claim 4, further comprising repeating the determining step for other provided operating conditions, and updating the training set using the determined configuration parameters and all provided operating conditions and repeating the training of the machine learning algorithm using the updated training set, wherein the determined configuration parameters are used for operation of the RF transmit assembly.

7. The method of claim 1, wherein using the predefined machine learning model for determining at least part of the set of configuration parameters is performed in response to detecting that the provided operating conditions are different from previously provided operating conditions.

8. The method of claim 1, wherein the measurable parameter is of physical property of a first component of the RF transmit assembly; the method further comprising:
providing multiple machine learning models each associated with a component of the RF transmit assembly;
selecting the predefined machine learning model from the multiple machine learning models that is associated with the first component.

9. The method of claim 8, wherein the operating conditions further comprise another measurable parameter of a second component of the RF transmit assembly, the determining step comprising using the predefined machine learning model and another selected machine learning model of the multiple models for the second component for determining the at least part of the set of configuration parameters and associated values for the operating conditions.

10. A computer program product comprising machine executable instructions stored on a non-transitory computer readable medium for execution by a processor, wherein execution of the machine executable instructions causes the processor to perform the method of claim 1.

11. A medical analysis system for configuring a radio frequency, RF transmit assembly, comprising: a memory containing machine executable instructions; and a processor for controlling the medical analysis system, wherein execution of the machine executable instructions causes the medical analysis system to:
provide operating conditions of the RF transmit assembly, the operating conditions being indicative of at least: a property of the RF pulse sequence and a measurable parameter that influences the RF pulse sequence property when operating the RF transmit assembly using the RF pulse sequence, wherein the measurable parameter comprises at least one of ambient temperature, temperature of a cooling water of the RF transmit assembly, junction temperatures of components of the RF amplifier, coil load of the transmit coil, power supply voltage of a power supply of a medical analysis system, power supply voltage of a power supply of the RF transmit assembly, the operating conditions being further indicative of a subject weight, subject height, imaging position, anatomy to be scanned;
use a predefined machine learning model for determining at least part of the set of configuration parameters and associated values for the operating conditions;
configure the RF transmit assembly in accordance with the determined configuration parameters.

12. The medical analysis system of claim 11, being configured to connect to multiple RF assemblies and to receive from the RF assemblies data of a training set indicative of sets of configuration parameters in association with respective operating conditions of the RF transmit assemblies.

13. The medical analysis system of claim 11 further comprising the RF transmit assembly.

14. A MRI system comprising the medical analysis system of claim 11, the MRI system being configured for acquiring image data.

* * * * *